(12) United States Patent
Phebus et al.

(10) Patent No.: US 11,182,666 B1
(45) Date of Patent: Nov. 23, 2021

(54) ARTIFICIAL NEURAL NETWORK ARCHITECTURE BASED ON LOOKUP TABLE

(71) Applicant: Amazon Technologies, Inc., Seattle, WA (US)

(72) Inventors: Taylor Phebus, Austin, TX (US); Asif Khan, Cedar Park, TX (US)

(73) Assignee: Amazon Technologies, Inc., Seattle, WA (US)

( * ) Notice: Subject to any disclaimer, the term of this patent is extended or adjusted under 35 U.S.C. 154(b) by 1026 days.

(21) Appl. No.: 15/805,956

(22) Filed: Nov. 7, 2017

(51) Int. Cl.
*G06N 3/063* (2006.01)
*H03K 19/17728* (2020.01)
*G06N 3/04* (2006.01)

(52) U.S. Cl.
CPC ........... *G06N 3/063* (2013.01); *G06N 3/04* (2013.01); *H03K 19/17728* (2013.01)

(58) Field of Classification Search
CPC ..... G06N 3/00; G06N 3/063; H03K 19/17728
USPC .......................................................... 706/33
See application file for complete search history.

(56) References Cited

U.S. PATENT DOCUMENTS

| | | | |
|---|---|---|---|
| 6,366,943 B1 * | 4/2002 | Clinton | G06F 7/02 708/551 |
| 7,092,863 B2 * | 8/2006 | Goldman | G05B 13/048 700/28 |
| 9,792,405 B2 * | 10/2017 | van Rooyen | G16B 40/00 |
| 2002/0107585 A1 * | 8/2002 | Lu | G05B 13/048 700/42 |
| 2013/0223516 A1 * | 8/2013 | Goldstein | H04N 19/12 375/240.03 |
| 2016/0093343 A1 * | 3/2016 | Ovsiannikov | G11C 7/1039 365/189.02 |

OTHER PUBLICATIONS

Han et al., "EIE: Efficient Inference Engine on Compressed Deep Neural Network," [online]. University of Cornell Library, May 2016 [retrieved on Nov. 2, 2017], Retrieved from the Internet: <URL:https://arxiv.org/abs/1602.01528>, 12 pages. (Year: 2016).*

(Continued)

*Primary Examiner* — Paulinho E Smith
(74) *Attorney, Agent, or Firm* — Kilpatrick Townsend & Stockton LLP

(57) ABSTRACT

In one example, an integrated circuit includes a first circuit, a second circuit, a third circuit, and a fourth circuit. The first circuit is configured to receive an input value and generate a first intermediate value based on a first probability density distribution associated with the input value. The second circuit comprises a set of multiplexer circuits configured to select, from a first set of candidate values and based on the first intermediate value, a first product of the first intermediate value and a weight value. The third circuit is configured to generate a second intermediate value based on a sum of the first product and a second product received from another circuit. The fourth circuit is configured to generate an output value based on the second intermediate value and a second probability density distribution associated with the second intermediate value.

23 Claims, 12 Drawing Sheets

(56) References Cited

OTHER PUBLICATIONS

Jouppi et al., "In-Datacenter Performance Analysis of a Tensor Processing Unit," 44th International Symposium on Computer Architecture (ISCA), Toronto, Canada (Jun. 24-28, 2017), 17 pages. (Year: 2017).*

Nurvitadhi et al., "Can FPGAs Beat GPUs in Accelerating Next-Generation Deep Neural Networks?" Proceedings of the 2017 ACM/SIGDA International Symposium on Field-Programmable Gate Arrays, Monterey, California, USA (Feb. 22-24, 2017), pp. 5-14. (Year: 2017).*

U. Lotric, P. Bulic', Applicability of approximate multipliers in hardware neural networks, Neurocomputing (2012), http://dx.doi.org/10.1016/j.neucom.2011.09.039 (Year: 2012).*

Laudani, Antonino et al. "On Training Efficiency and Computational Costs of a Feed Forward Neural Network: A Review." Computational intelligence and neuroscience vol. 2015 (2015): 818243. doi:10.1155/2015/818243 (Year: 2015).*

Kinks, H. (Jun. 8, 2016). Närvivõrgu realiseerimine väliprogrammeeritaval loogikal. Avaleht—TalTech raamatukogu digikogu. https://digikogu.taltech.ee/testimine/en/Item/bb000923-0807-497a-927c-e18eb0678cad (Year: 2016).*

Clukey, Steven Andrew, "Architecture for Real-Time, Low-SWaP Embedded Vision Using FPGAs." Master's Thesis, University of Tennessee, 2016. https://trace.tennessee.edu/utk_gradthes/4281 (Year: 2016).*

Tang, Kun Won, "Instantaneous Learning Neural Networks." (1999). LSU Historical Dissertations and Theses. 7130. https://digitalcommons.lsu.edu/gradschool_disstheses/7130 (Year: 1999).*

Gisselquist Technology. (Sep. 27, 2017). Understanding the effects of quantization. The ZipCPU by Gisselquist Technology. https://zipcpu.com/dsp/2017/09/27/quantization.html (Year: 2017).*

Gysel, Philipp, *Ristretto: Hardware-Oriented Approximation of Convolutional Neural Networks*, Master's Thesis, University of California, Davis (May 2016), 73 pages.

Han et al., "EIE: Efficient Inference Engine on Compressed Deep Neural Network," [online]. University of Cornell Library, May 2016 [retrieved on Nov. 2, 2017], Retrieved from the Internet: <URL: https://arxiv.org/abs/1602.01528>, 12 pages.

Jouppi et al., "In-Datacenter Performance Analysis of a Tensor Processing Unit," 44th International Symposium on Computer Architecture (ISCA), Toronto, Canada (Jun. 24-28, 2017), 17 pages.

Nurvitadhi et al., "Can FPGAs Beat GPUs in Accelerating Next-Generation Deep Neural Networks?" Proceedings of the 2017 ACM/SIGDA International Symposium on Field-Programmable Gate Arrays, Monterey, California, USA (Feb. 22-24, 2017), pp. 5-14.

UltraScale Architecture and Product Data Sheet: Overview [online], Xilinx, Inc., 2013 [retrieved on Nov. 2, 2017], Retrieved from the Internet: <URL: https://www.xilinx.com/support/documentation/data_sheets/ds890-ultrascale-overview.pdf>, 43 pages.

UltraScale+ FPGAs Product Tables and Product Selection Guide, [online], Xilinx, Inc., Feb. 2017 [retrieved on Nov. 2, 2017], Retrieved from the Internet: <URL: https://www.xilinx.com/support/documentation/selection-guides/ultrascale-plus-fpga-product-selection-guide.pdf >, 8 pages.

\* cited by examiner

ARTIFICIAL NEURAL NETWORK ARCHITECTURE BASED ON LOOKUP TABLE

BACKGROUND

Artificial neural networks are computing systems with an architecture based on biological neural networks. Artificial neural networks can be trained, using training data, to learn about how to perform a certain computing task.

A neural network may include a set of processing nodes. Each processing node can process a piece of the input data to generate an output, and the final decision can be generated based on a combination of the outputs of the set of processing nodes. As part of the processing, each processing node can perform a set of arithmetic operations such as, for example, floating-point multiplications and additions, etc. The arithmetic operations of the processing nodes may be performed by graphical processing units (GPU), which typically include circuitries and data paths optimized for high speed arithmetic operations.

BRIEF DESCRIPTION OF THE DRAWINGS

Various embodiments in accordance with the present disclosure will be described with reference to the drawings, in which.

DETAILED DESCRIPTION

Figure 1:
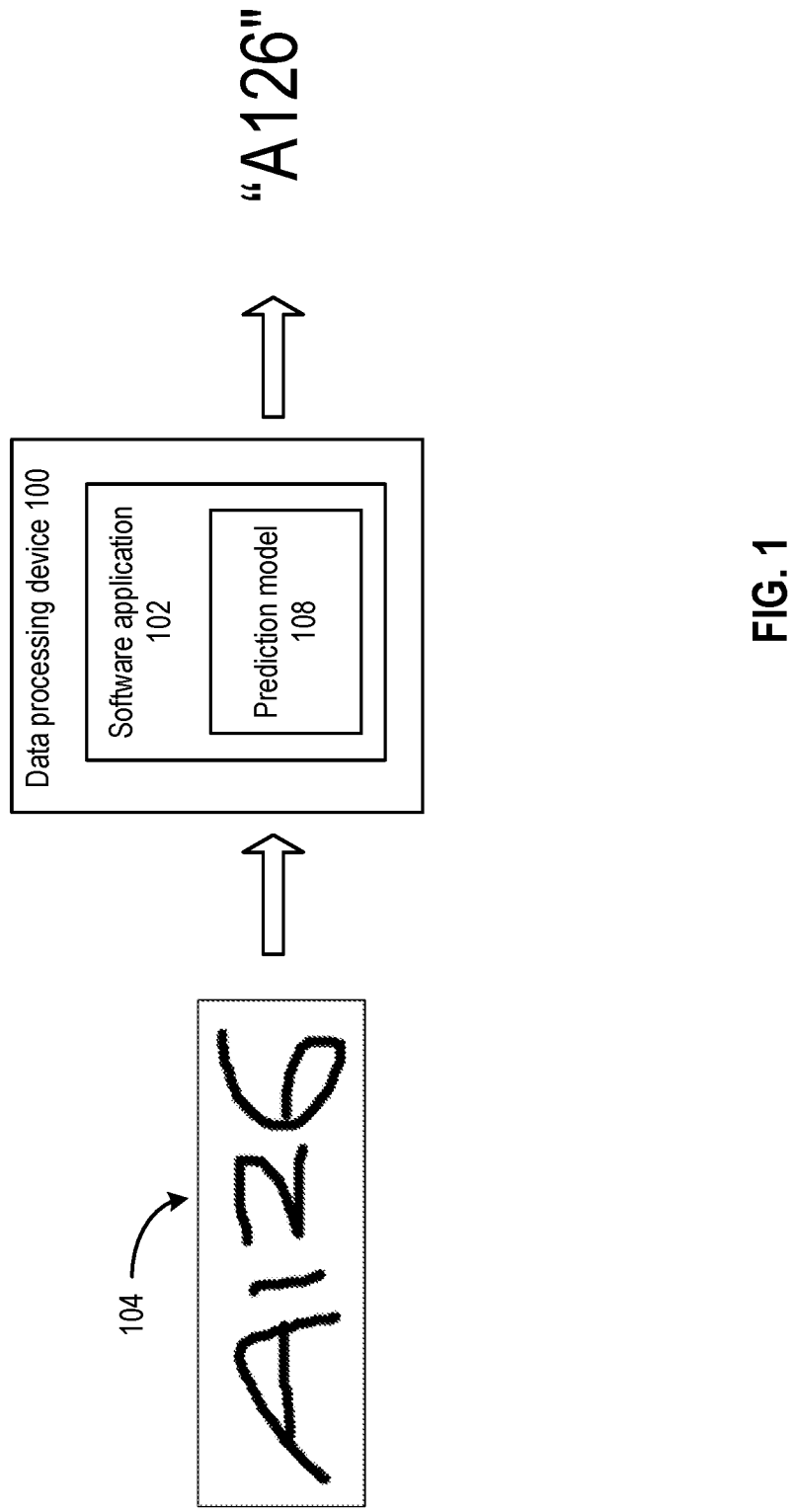
FIG. 1 illustrates an example data processing device that uses techniques disclosed herein to process an image.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiments being described.

An artificial neural network (herein after "neural network") may include multiple processing nodes. The processing nodes can be divided into layers including, for example, an input layer, an intermediate layer, and an output layer. Each processing node of the input layer receives an element of an input set, and scales the element with a weight to indicate the element's degree of influence on the output. The processing nodes in the intermediate layer may combine the scaled elements received from each processing node of the input layer to generate a set of intermediate outputs. For example, each processing node in the intermediate layer may generate a sum of the element-weight products, and then generate an intermediate output by applying an activation function to the sum. The intermediate outputs from each processing node of the intermediate layer may be considered as an activated vote to determine the final output at the output layer. Each intermediate output may also be scaled with a weight. The output layer may generate a sum of the scaled intermediate outputs and generate a binary output (e.g., "yes" or "no") based on whether the sum of the scaled intermediate outputs exceeds a threshold. The weights can be updated by a training process. For example, as part of the training process the neural network may receive different input sets associated with a target binary output (e.g., "yes"). The weights can be updated to maximize the probability of the output layer generating the target binary output for the different input sets.

As an example, the neural network may be used to perform a classifier operation such as, for example, identifying a person from a facial image. The input layer may receive a set of pixel data corresponding to different locations of the facial image. Each processing node of the input layer may be configured to process pixel data corresponding to a particular location of the facial image, and assign a weight to the pixel data from that particular location. The weight assigned to a location of the facial image may reflect, for example, a number of image features extractable from that location of the facial image for identifying a person. In a case where the location of the facial image has more distinguishing features, the weight of that location can be increased, and vice versa. Each processing node of the input layer may scale the received pixel data with the assigned weight, and transmit the scaled pixel data to the intermediate layer. The intermediate layer can generate a sum of the scaled pixel data, and pass the sum to an activation function to generate an intermediate output. The output layer can further scale each intermediate output with a weight, and calculate a sum of the scaled intermediate outputs. If the sum of the scaled intermediate outputs exceeds a threshold, the output layer can generate a decision output indicating that the facial image corresponds to a particular person.

The input set and the intermediate outputs are typically represented by floating-point numbers. For example, the input set can be floating-point numbers representing light intensities at different pixel locations. The intermediate outputs are also floating-point numbers generated, either directly or indirectly, based on the floating-point input set. Currently, a neural network processing node can perform a set of floating-point multiplications for the scaling of the input set and the intermediate outputs by their associated weights, and a set of floating-point additions to generate, for example, the sum of scaled input sets, the sum of scaled intermediate outputs, etc.

To improve the speeds at which the arithmetic operations (especially floating-point multiplications) are performed and the decisions are generated, the processing nodes of the neural networks can be implemented with graphical processing units (GPU). GPUs typically include hardware circuitries (e.g., adders, multipliers, etc.) and data paths optimized to perform high speed arithmetic operations. Although GPUs can provide high performance, they tend to consume a lot of power. Moreover, the additional hardware circuitries and data paths of the GPUs also take up considerable chip space. All these can severely limit the deployment of computing devices and applications for computations and problem-solving using neural network architectures.

Embodiments of the present disclosure relate to a neural network architecture that employs lookup table techniques to approximate the scaling of data by associated weight for generating a classifier decision. Specifically, the processing nodes of the input layer of a neural network can include a first set of lookup tables. Each of the first set of lookup tables can map a set of candidate input codes to a set of candidate output codes, with each candidate output code representing a product of the respective candidate input code and a weight. To approximate a set of multiplication operations for the scaling of input data, a processing node at the input layer can use the first set of lookup tables to map the received input data to one of the set of candidate output codes, to output a code representing a product between the input data and the weight. Further, the processing nodes of the intermediate layer of the neural network can include a set of summation circuits and a second set of lookup tables. Each of the summation circuits can generate a sum of the products received from the input layer. The second set of lookup tables can be used to map the sum to an intermediate output representing a result of applying an activation function on the sum. The output layer may also include a third set of lookup tables to output a result of scaling of the intermediate outputs, and a decision circuit to generate a classifier decision based on a sum of the scaled intermediate outputs.

To reduce the sizes of the first set of lookup tables (to approximate multiplication operations for scaling of input data) and the sizes of the third set of lookup tables (to approximate multiplication operations for scaling of intermediate outputs), the number of bits used to represent the input data and the intermediate outputs can be limited to a pre-determined number. To extend the ranges of the input data and the intermediate outputs that can be represented by the pre-determined number of bits, both the input data and the intermediate outputs can be encoded based on probability distributions. For example, the encoding can include mapping different subranges of the intermediate output to a different set of codes, using the second set of lookup tables, to perform quantization of the intermediate output. A smaller set of codes can be mapped to a subrange of the intermediate outputs associated with a lower probability density, whereas a larger set of codes can be mapped to a subrange of the intermediate outputs associated with a higher probability density. Similar arrangements can be made for the encoding of the input data. With such arrangements, the quantization errors for more-frequent intermediate outputs and input data that occur more frequently can be suppressed at the expense of higher quantization errors for less-frequent intermediate outputs and input data. Other techniques are disclosed to further reduce the size and the number of lookup tables to improve the efficiency of operation at the neural network.

Given that lookup tables use much less power than floating-point multipliers, a neural network implemented with lookup tables for providing multiplication results can lead to significant reduction in power consumption. Moreover, certain integrated circuit technologies (e.g., field programmable gate arrays (FPGA)) are optimized for lookup table operations and are typically more power-efficient than GPUs. As a result, neural network processing can be performed in a more power-efficient manner, which facilitates the adoption of neural network processing to solve a wider range of problems.

FIG. 1 illustrates an example data processing device 100 that uses techniques disclosed herein to process a set of data. Data processing device 100 can be, for example, a computing device operating a software application 102 to predict information included in a data sequence, and perform a pre-determined function based on the prediction. For example, data processing device 100 can be part of an image recognition service provided to identify certain objects (e.g., texts, a person, etc.) from an image. It is understood that the image recognition service is merely provided as an illustrative example, and that techniques disclosed herein can be used for other data processing applications including, for example, text-based data processing (e.g., processing of search queries), audio data processing, data regression (e.g., predicting a credit score based on certain financial information of a person), etc.

The image recognition service can be provided in a multi-tenant compute service system. The multi-tenant compute service system may typically include a plurality of servers that can host data and be used by multiple clients or organizations to run instances, such as virtual machine instances or bare-metal instances (e.g., operating systems that run directly on the server hardware). In most cases, instances, such as bare-metal or virtual machine instances, in a multi-tenant compute service system may be allocated to a client when the client needs them and decommissioned when they are no longer needed, such that the resources can be reallocated to other clients. In the present disclosure, the terms "tenant," "client," and "customer" may be used interchangeably, although such terms do not necessarily imply the existence of any particular business arrangement. The term "instance" may refer to, for example, an instance that is executed directly on server hardware or as a virtual machine. Different types of instances generally correspond to different hardware functions and/or arrangements of hardware (e.g., different amounts of available memory and/or processing hardware). In the example of FIG. 1, the multi-tenant compute service system may provide the image recognition service when the client needs it and decommissioned when it is no longer needed, such that the resources supporting the image recognition service (e.g., access to software application 102, and the underlying hardware resources for processing software application 102) can be reallocated to other clients.

As shown in FIG. 1, software application 102 can receive pixel data of an image 104 from a user. Image 104 may include an array of pixels and perform analysis on the pixel data, and predict a set of objects 106 depicted in image 104. In the example of FIG. 1, data processing device 100 may predict that image 104 includes a set of texts "A126." Software application 102 may, for example, generate a document including the set of texts "A126" to provide a result of the analysis.

Figure 2:
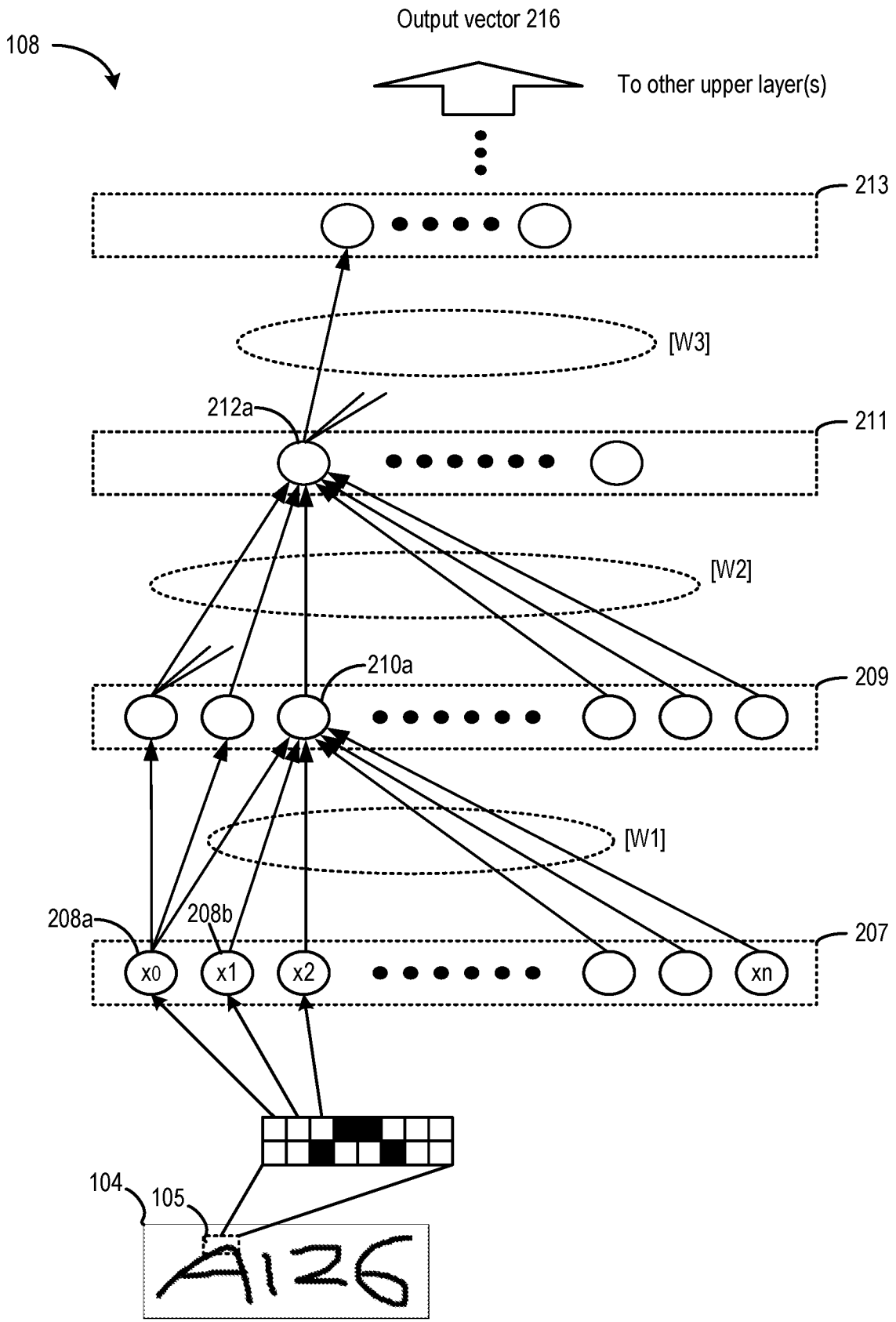
FIG. 2 is a simplified block diagram of a prediction model that uses techniques disclosed herein, according to certain aspects of the present disclosure.

Software application 102 further includes a prediction model 108 for processing pixel data of image 104 to predict the objects included in the image. Prediction model 108 can be in the form of an artificial neural network. The artificial neural network may include a plurality of processing nodes, with each processing node configured to process part of the input pixel data, or to further process the intermediate outputs from other processing nodes. FIG. 2 illustrates an example of prediction model 108 in the form of a feedforward neural network with multiple hidden layers that uses techniques disclosed herein. It is understood that the disclosed techniques are applicable to different kinds of artificial neural network, such as a feedforward neural network with a single hidden layer, convolutional neural network, recurrent neural network, etc.

As shown in FIG. 2, prediction model 108 may include a set of processing nodes organized in a set of layers including, for example, layer 207, layer 209, layer 211, and layer 213. Layer 207 may be an input layer, whereas layers 209, 211, and 213 may be intermediate layers. Prediction model 108 further includes an output layer (not shown in FIG. 2), and may include additional intermediate layers between intermediate layer 213 and the output layer.

Input layer 207 may process pixel data representing different portions of image 104. For example, in the example of FIG. 2, layer 207 may include processing nodes 208a-208n, each configured to receive a pixel value (e.g., $x_0$, $x_1$, $x_2$, ... $x_n$) corresponding to a pre-determined pixel within the array of pixels of portion 105, and forward the pixel value to each of the processing nodes of intermediate layer 209.

Intermediate layer 209 may scale each of the received pixel values received from input layer 207 with a weight defined based on a matrix W1. As to be discussed in more details below, the scaling can be performed using a lookup table that maps the pixel value (e.g., $x_0$) to an output representing the scaling of the pixel value with the associated weight. Intermediate layer 209 may further process the scaled outputs from layer 207 to generate a set of intermediate outputs. For example, assuming there are n processing nodes in layer 207, processing node 210a may generate a sum of the scaled outputs received from layer 207 based on the following equation:

$$sum_{210a} = \sum_{i=0}^{n}(W1_i \times x_i) \quad \text{(Equation 1)}$$

Here, $sum_{210a}$ represents a sum generated by processing node 210a. $W1_i \times x_i$ represents a scaling of a particular pixel value (e.g., $x_0$) with the associated weight (e.g., $W1_0$).

The sum may also represent a dot-product between an input vector comprising a number of elements (e.g., pixel values) and a weight vector (e.g., W1). As to be discussed in more details below, the summation can be either performed by a summing circuit, or by a set of lookup tables that maps a set of pixel values and their associated weights to a value representing a sum of the set of scaled pixel values (scaled by their associated weights).

Each processing node of intermediate layer 209 can also process the sum with an activation function to generate an activation output. The activation function may translate the sum into a decision of whether to forward the sum to intermediate layer 211 to influence the output decision (analogous to the firing of an actual biological neuron). An example of activation function can be a rectified linear unit (ReLu) defined according to the following equation:

$$ReLu(y) = max(0, y) \quad \text{(Equation 2)}$$

A processing node of intermediate layer 209 (e.g., processing node 210a) may process the sum with the ReLu function to generate an intermediate output based on the following equation:

$$\text{intermediate\_output}_{210a} = ReLu(Sum_{210a}) \quad \text{(Equation 3)}$$

As to be discussed in more details below, the generation of activation output can be performed also using a lookup table that maps the sum to an output representing the activation output by the ReLu function. In some examples, the summation (e.g., for generating $sum_{210a}$) and the application of the activation function (e.g., for generating $\text{intermediate\_output}_{210a}$) can also be integrated in a single lookup table, as to be described in more details below.

Each processing node of intermediate layer 211 may generate a set of outputs by scaling each of the intermediate outputs received from intermediate layer 209 with a weight defined according to matrix W2. Intermediate layer 211 may also sum the scaled intermediate outputs from layer 209. For example, assuming there are m processing nodes in intermediate layer 209, processing node 212a may generate a sum of the scaled intermediate outputs received from intermediate layer 209, followed by applying the ReLu function of Equation 2, based on the following equation:

$$\text{intermediate\_output}_{212a} = ReLu\left(\sum_{i=0}^{m}(W2_i \times \text{intermediate\_output})\right) \quad \text{(Equation 4)}$$

Here, $\text{intermediate\_output}_{212a}$ represents an intermediate output generated by processing node 212a based on applying an activation function to a sum of scaled intermediate outputs from intermediate layer 209, with the scaling based on the matrix W2. Each processing node of intermediate layer 211 receives an intermediate output (e.g., $\text{intermediate\_output}_{210a}$) from each processing node of intermediate layer 209, scales the received intermediate output with an associated weight according to weight matrix W2, and generates a sum (e.g., $\text{intermediate\_output}_{212a}$) by summing the scaled intermediate outputs, and generates $\text{intermediate\_output}_{212a}$ by applying the activation function to the sum.

Intermediate layer 213 (or other upper intermedia layers) may perform similar functions as intermediate layer 211. For example, each node of intermediate layer 213 may receive an intermediate output from intermediate layer 211 (e.g., $\text{intermediate\_output}_{212a}$), scale the received intermediate output with an associated weight based on weight matrix W2, generates a sum by summing the scaled intermediate outputs from intermediate layer 211, and generates another set of intermediate outputs. The intermediate outputs can be forwarded to other upper layers, and ultimately to the output layer for the generation of output vector 216.

Output vector 216 may include various kinds of information which prediction model 108 can use to generate a decision. For example, output vector 216 may be compared against a reference vector associated with the alphabet "A", and a decision about whether portion 105 of image 104 corresponds to the alphabet "A" can be made based on the comparison result.

The parameters of prediction model 108, including weight matrices W1 and W2 may be configured in a training process. Prediction model 108 may receive a set of training data associated with specific labels that reflect the content of the training data. For example, the set of training data may include a set of image data known to depict the alphabet "A". During the training, prediction model 108 can be provided with the set of training data, and the parameters of prediction model 108 can be updated based on an objective function such as, for example, to maximize the likelihood of prediction model 108 generating a target decision (e.g., to determine that the set of image data depicts the alphabet "A" from the set of training data. In some embodiments, the training can take place at a server, which then transmits the parameters to data processing device 100.

Figure 3:
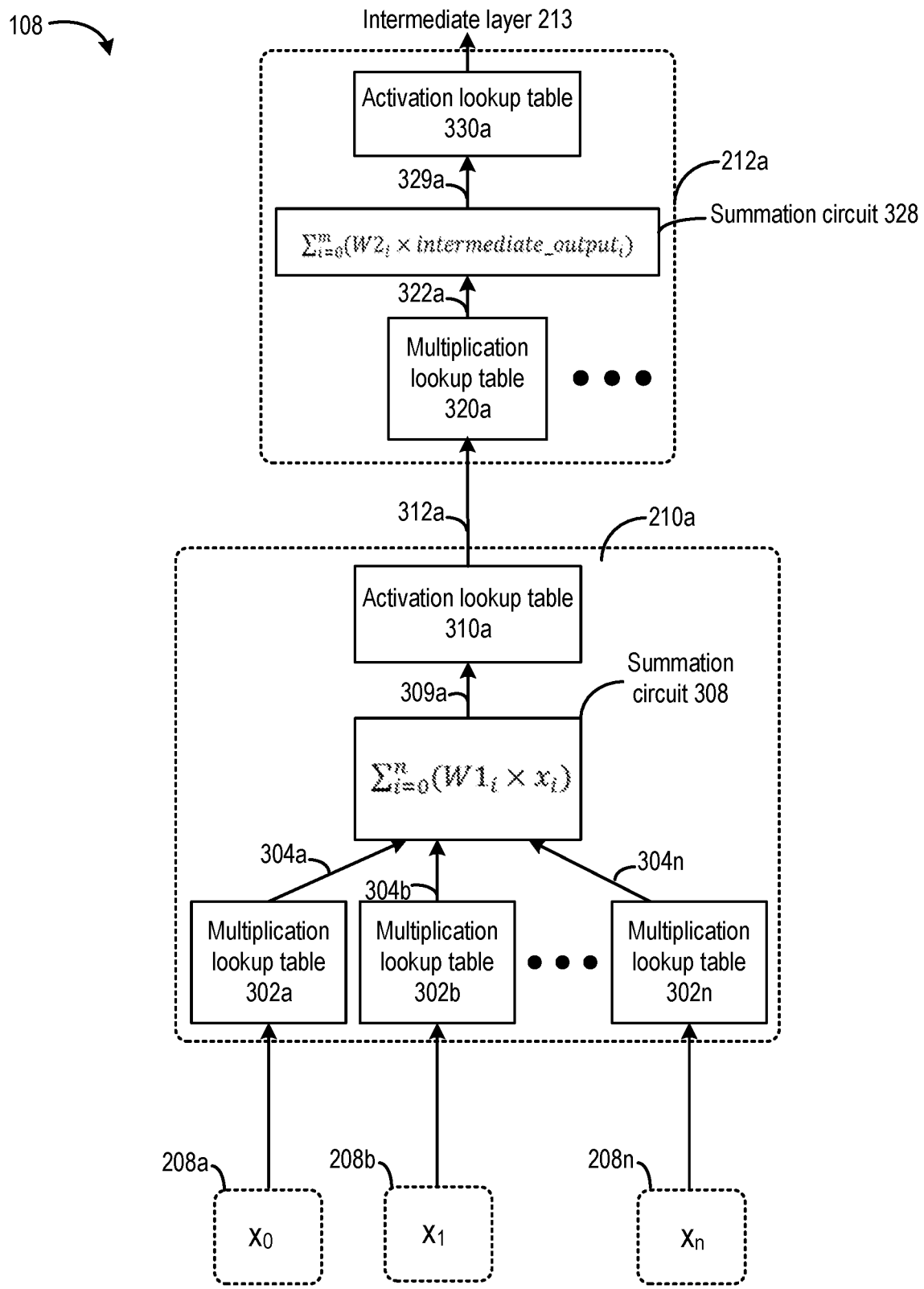
FIG. 3 is a simplified block diagram for some of the internal components of the prediction model of FIG. 2, according to certain aspects of the present disclosure.

Reference is now made to FIG. 3, which illustrates an example of some of the internal components of prediction model 108. As shown in FIG. 3, each of processing nodes 208a-208n (of layer 207) may store an input. For example, processing node 208a may store an input $x_0$, processing node 208b may store an input $x_1$, etc.

Moreover, processing node 210a also include a set of lookup tables to provide an approximated scaling of the inputs. For example, processing node 210a includes a multiplication lookup table 302a to map input $x_0$ to a multiplication output 304a, which represents a product between $x_0$ and an associated weight $W1_0$. Processing node 210a also includes a multiplication lookup table 302b to map $x_1$ to a multiplication output 304b representing a product between $x_1$ and an associated weight $W1_1$, and a lookup table 302n to map $x_n$ to a multiplication output 304n representing a product between $x_n$ and an associated weight $W1_n$. Multiplication outputs 304a-304n typically are represented by a larger number of bits than the inputs $x_0$-$x_n$. For example, each of inputs $x_0$-$x_n$ may be represented by 5 bits, whereas each of multiplication outputs 304a-304n may be represented by 8 bits. Processing node 210a further includes a summation circuit 308 to generate a sum 309a based on multiplication outputs 304a-304n provided by processing nodes 208a-208n. Summation circuit 308 may include adders. In some embodiments, as to be discussed in more details below, summation circuit 308 may also include lookup tables to map a combination of multiplication outputs 304a-304n to a value representing a sum (or a partial sum). Sum 309a generated may have the same number of bits as each of multiplication outputs 304a-304n (e.g., 8 bits). Summation circuit 308 can forward the sum to an activation lookup table 310a to generate an intermediate output 312a (e.g., intermediate_output$_{210a}$), which can represent the result of processing the sum with an activation function (e.g., a ReLu function) as discussed above.

Further, processing node 212a includes a set of multiplication lookup tables 320 (e.g., multiplication lookup table 320a), a summation circuit 328, and an activation lookup table 330a. Multiplication lookup table 320a may generate a multiplication output 322a representing a product between intermediate output 312a and an associated weight $W2_1$. As to be discussed in more details below, the complexity of multiplication lookup table 320 can be reduced by having intermediate output 312a represented by a smaller number of bits (e.g., 5 bits) than the sum of multiplication outputs 304a-304n (8 bits), to reduce. Summation circuit 328 can generate a sum 329a based on intermediate output 312a, as well as multiplication outputs from other processing nodes of intermediate layer 209 (not shown in FIG. 3). Summation circuit 308 can forward sum 329a to an activation lookup table 330a, which can be similar to activation lookup table 310a, to generate an element of vector 216. Similar to summation circuit 308, summation circuit 328 may also include adders, lookup tables, etc.

Figure 4:
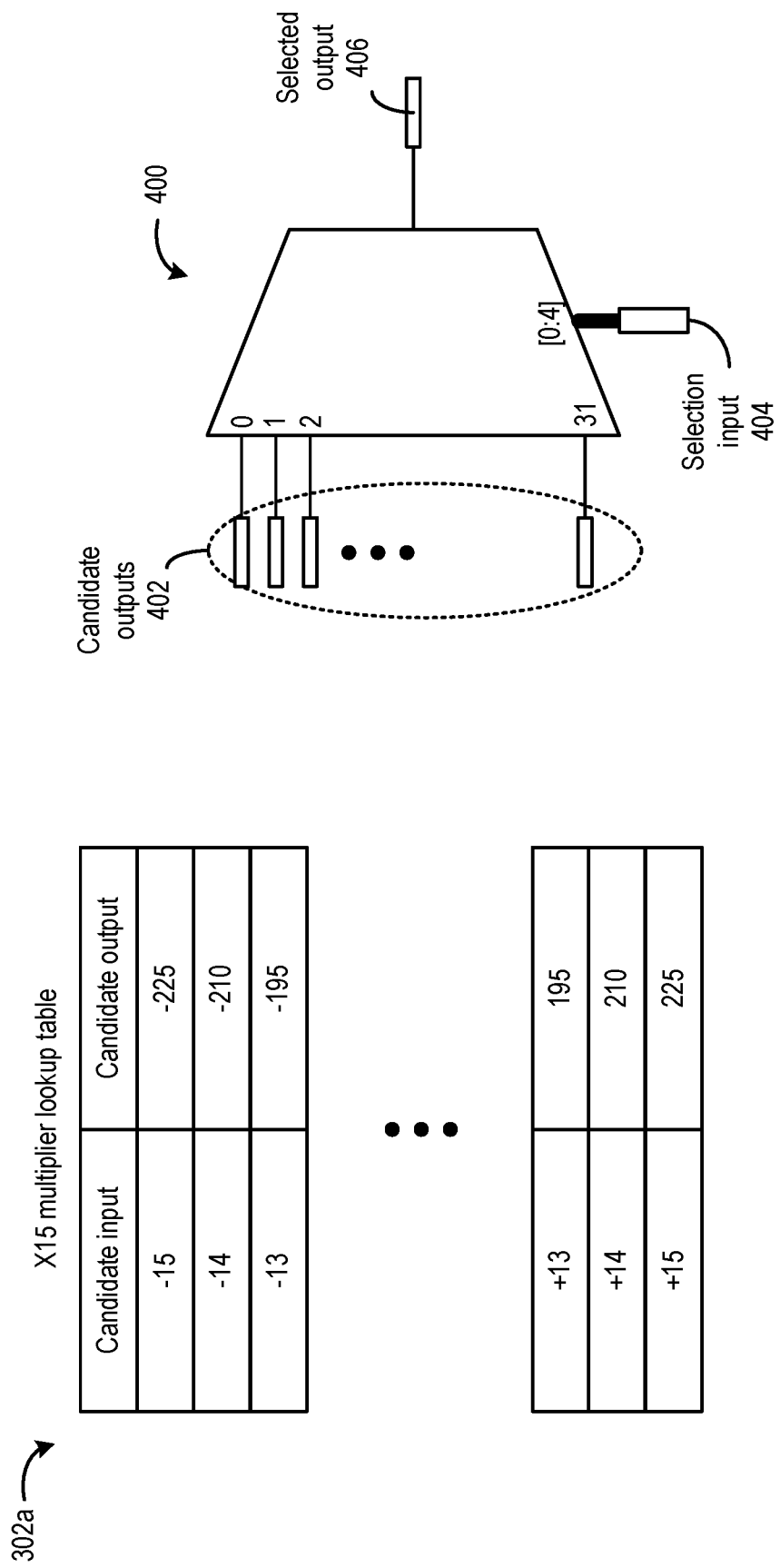
FIG. 4 illustrates examples of a multiplication lookup table to implement the prediction model of FIG. 2, according to certain aspects of the present disclosure.

Each of multiplication lookup tables 302a-302n and 320a may map a set of candidate input codes to a set of candidate output codes in a one-on-one fashion, with each of the candidate output codes representing a multiplication result between the mapped candidate input code and a weight. FIG. 4 illustrates an example of multiplication lookup table 302a. In the example of FIG. 4, multiplication lookup table 302a is to generate an output that represents a product between an input and a weight of 15. Multiplication lookup table 302a may include a set of entries, with each entry mapping a candidate input code to a candidate output code that represents a product between the mapped candidate input code with a weight of 15.

Although FIG. 4 illustrates that the candidate input codes and candidate output codes as whole numbers, it is understood that multiplication lookup table 302a can map a set of candidate input floating point numbers to a set of candidate output floating point numbers. For example, each candidate output can include a set of bits representing an exponent and a set of bits representing a mantissa.

Multiplication lookup tables 302a, 302b, and 320a can be implemented in different forms. For example, each of multiplication lookup tables 302a, 302b, and 320a can include a multiplexer circuit 400 that are connected to the set of candidate output codes. In the example of FIG. 4, multiplexer circuit 400 can be a 32:1 multiplexer connected to a set of 32 registers storing 32 candidate output codes 402. The 32 registers can be programmed based on a weight (e.g., defined based on weight matrix W1, W2, etc.) and the set of candidate input codes. Multiplexer circuit 400 can also include a 5-bit selection input 404. The selection input may be driven based on, for example, a pixel value (for multiplication lookup table 302a and 302b), a an intermediate output value (for multiplication lookup table 320a), etc. Based on the selection input, multiplexer circuit 400 can route one of the candidate output codes to selected output 406, to provide an output approximating a multiplication between a value represented by selection input and a weight. Multiplexer circuit 400 can be part of an integrated circuit (e.g., an ASIC, an FPGA, etc.) of data processing device 100. As another example, multiplication lookup table 302 can be stored in a memory device, such as a dynamic random access memory (DRAM) device, a static random access memory (SRAM) device, etc., that is part of data processing device 100. Each candidate output code can be associated with a memory address derived based on the mapped candidate input code. To provide a multiplication result between an input and a weight, data processing device 100 can generate a memory address from the input, and use the memory address to access a candidate output code from a multiplication lookup table stored in the memory device.

Referring back to FIG. 3, activation lookup table 310a may also map a set of input candidate codes (e.g., of sum 309a) to a set of output candidate codes, with the set of output candidate codes representing a result of applying an activation function (e.g., ReLu) to the set of input candidate codes. In some embodiments, the mapping can be many-to-one, with multiple input candidates mapped to an output candidate. Such arrangements may be provided due to mapping a larger set of input candidates to a smaller set of output candidates. For example, as discussed above, activation lookup table 310a may map sum 309a, which may be represented by 8-bit numbers, to intermediate output 312a, which may be represented by 5-bit numbers. The set of possible values for sum 309a (from the summation of different combinations of multiplication outputs 304a-304n) may be larger than the set of possible values for intermediate output 312a. Therefore, multiple values of sum 309a can be mapped to a single value for intermediate output 312a.

Figure 5:
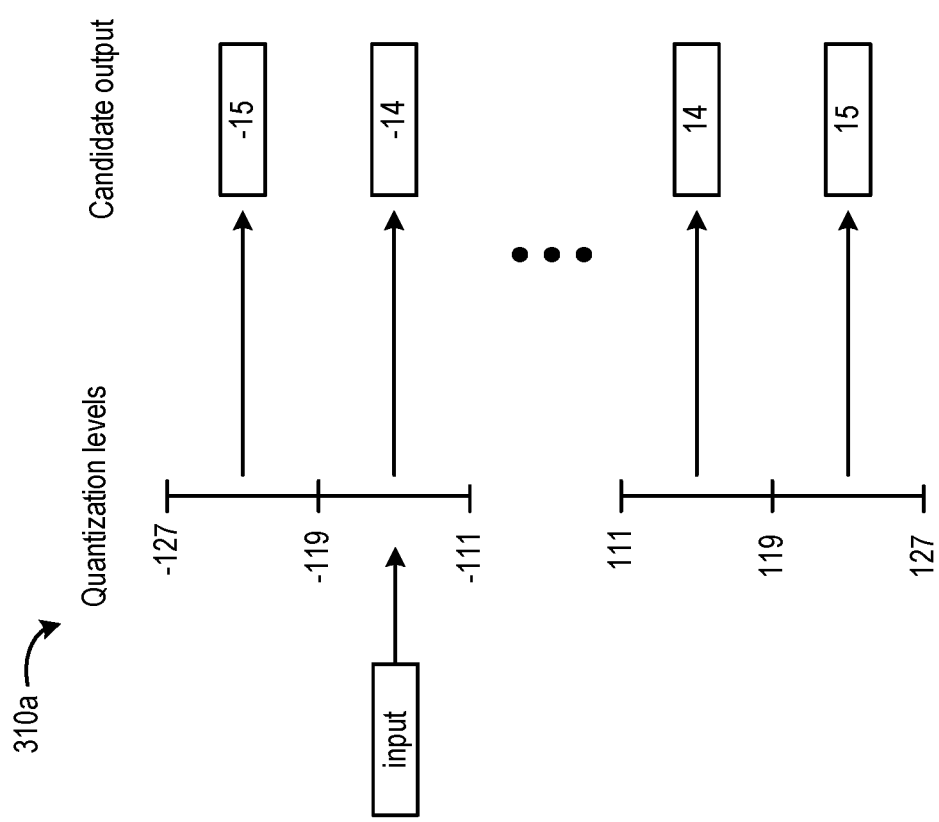
FIG. 5 illustrates an example of an activation lookup table to implement the prediction model of FIG. 2, according to certain aspects of the present disclosure.

The mapping of multiple values of sum 309a to a single value for intermediate output 312a can be in the form of quantization, in which values of sum 309a between two adjacent quantization levels are mapped to a single value for intermediate output 312a. The single value for intermediate output 312a may represent a quantized sum 309a. Reference is now made to FIG. 5, which illustrates an example of activation lookup table 310a. As shown in FIG. 5, activation lookup table 310a may include multiple quantization levels (e.g., −127, −119, −111, 111, 119, 127, etc.). An input that falls within a range defined by two adjacent quantization levels may be mapped to a single candidate output code. In the example of FIG. 5, an input that falls between −119 and −111 may be mapped to a candidate output code of −14.

Activation lookup table 310a can also be implemented in different forms. For example, activation lookup table 310a can include a multiplexer circuit similar to multiplexer circuit 400 (of FIG. 4) connected to a set of candidate output codes. The multiplexer circuit 400 can also be a 32:1 multiplexer connected to a set of 32 candidate output codes, and includes a 5-bit selection input. The 5-bit selection input can be connected to the first five most significant bits of the 8-bit sum 309a. As another example, activation lookup table 310a can be stored in a DRAM device, an SRAM device, etc., where each candidate output code can be associated with (and retrieved by) a memory address derived based on the first most significant bits of the 8-bit sum 309a.

While the mapping of 8-bit sum 309a to 5-bit intermediate output 312a reduces the number of input bits to multiplication lookup table 320a, the mapping can introduce quantization errors. Referring to the example of FIG. 5, activation lookup table 310a outputs the same candidate output code (−14) for any input that falls between the range of −111 and −119 and cannot distinguish between different inputs within that range. The lack of distinction between different inputs within the range can introduce a quantization error. For example, assuming that the middle of the range (−115) would have been mapped to the candidate output code −15 in a one-to-one mapping, the maximum quantization error can be the difference between the boundary (e.g., −119 or −111) and the middle of the range (−115). The quantization error increases as a larger range of input is mapped to a single candidate output code.

Figure 6A:
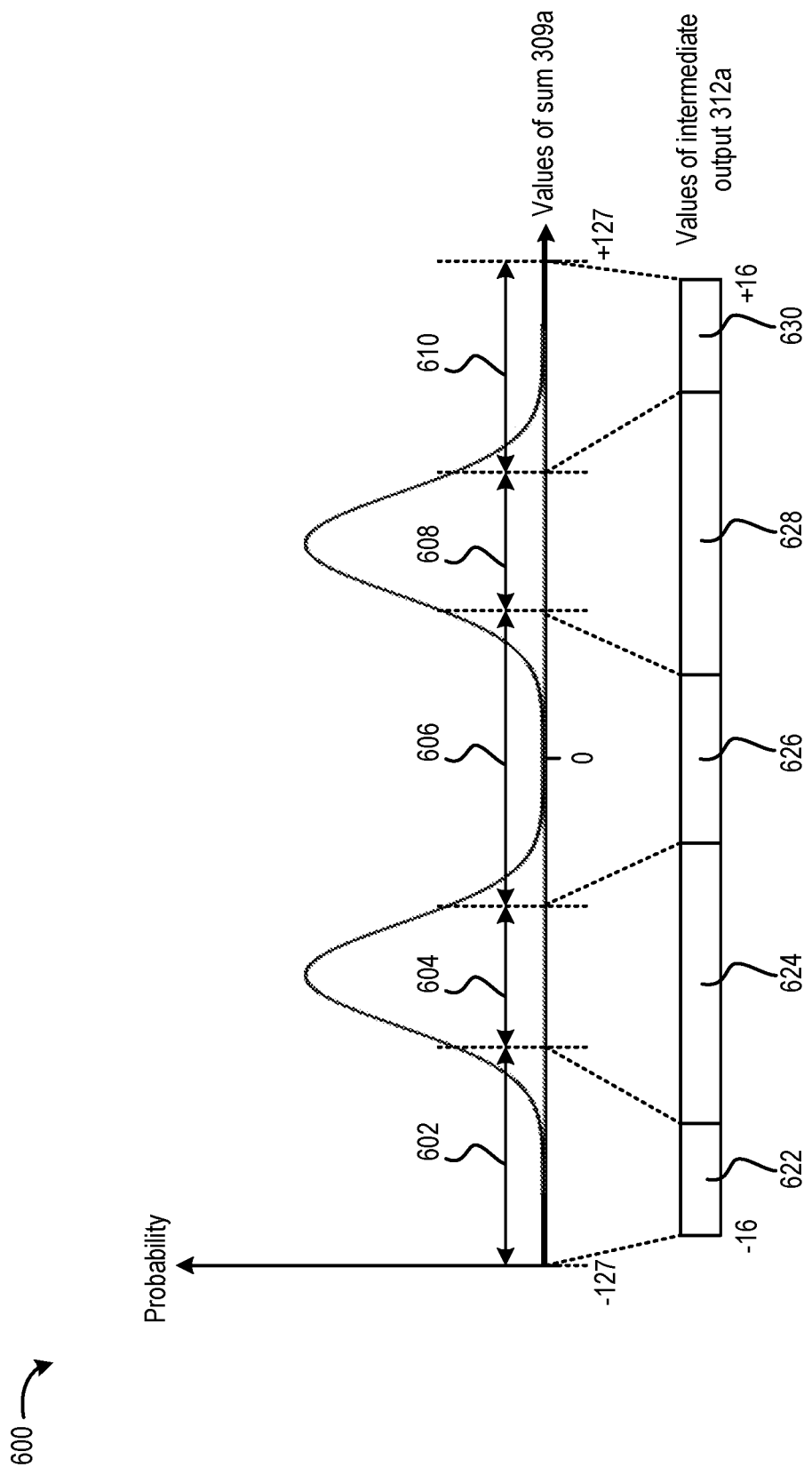
FIGS. 6A and 6B illustrate examples of a variable mapping scheme to implement the prediction model of FIG. 2, according to certain aspects of the present disclosure.

In some embodiments, the mapping sum 309a to the candidate output codes for intermediate output 312a can be based on a probability density distribution, to reduce the average quantization errors in the intermediate outputs, which can improve the likelihood of prediction model 108 making the correct prediction. As discussed above, the quantization error increases as a larger range of input is mapped to a single candidate output code. To reduce the average quantization errors, activation lookup table 310a can employ a variable mapping scheme based on a distribution of a probability of occurrence for different values of sum 309a within a pre-determined range. Reference is now made to FIG. 6A, which illustrates an example of the variable mapping scheme. FIG. 6A illustrates a probability density distribution graph 600 for different values of sum 309a within a range between −127 and 127. The range can be divided into a subrange 602, a subrange 604, a subrange 606, a subrange 608, and a subrange 610. In the example of FIG. 6A, each subrange may be associated with a different cumulative probability densities. A cumulative probability density for a subrange can be determined based on the area under the probability graph within the subrange, with a larger area indicating a larger cumulative probability density. The cumulative probability densities for each subrange may indicate a degree of likelihood a value of sum 309a is in that subrange. In the example of FIG. 6A, subranges 602 and 610 may have the lowest cumulative probability densities, followed by the cumulative probability density of subrange 606, whereas subranges 604 and 608 may have the highest cumulative probability densities.

The probability density distribution graph can be generated based on a count for different values of sum 309a when prediction model 108 process a set of input pixel data. The set of input pixel data may be, for example, completely randomized following a uniform distribution. The set of input pixel data may also include samples of pixel data that have been processed by prediction model 108 before, and/or typical pixel data to be processed by prediction model 108. For example, if prediction model 108 is used as part of an optical character recognition system, the probability distribution of sum 309a can be obtained by feeding different images of documents including a wide and randomly-distributed variety of alphabet characters.

Referring back to FIG. 6A, each of subranges 602, 604, 606, 608, and 610 of sum 309a is mapped to a subrange of intermediate output 312a, which ranges from −16 to 16. To reduce the average quantization error, subranges of sum 309a of lower cumulative probability density can be mapped to a smaller subrange of intermediate output 312a, whereas subranges of sum 309a of higher cumulative probability density can be mapped to a larger subrange of intermediate output 312a. For example, subranges 602, 606, and 610 of sum 309a are mapped to, respectively, subranges 622, 626, and 630 of intermediate output 312a. Subranges, 626, and 630 are relatively small subranges of intermediate output 312a. Although such mapping increases the quantization errors for subranges 602 and 610, due to their relatively low probability densities, values of sum 309a are probably not well represented in these subranges, which can lead to little degradation in the average quantization errors. On the other hand, subranges 604 and 608 of sum 309a are mapped to, respectively, subranges 624 and 628 of intermediate output 312a. Subranges 624 and 628 are the relatively large subranges of intermediate output 312a, which reduces the quantization errors for subranges 624 and 628. Given that subranges 624 and 628 are associated with high probability densities, values of sum 309a are probably well represented in these subranges, which can lead to substantial improvement in the average quantization errors.

Figure 6B:
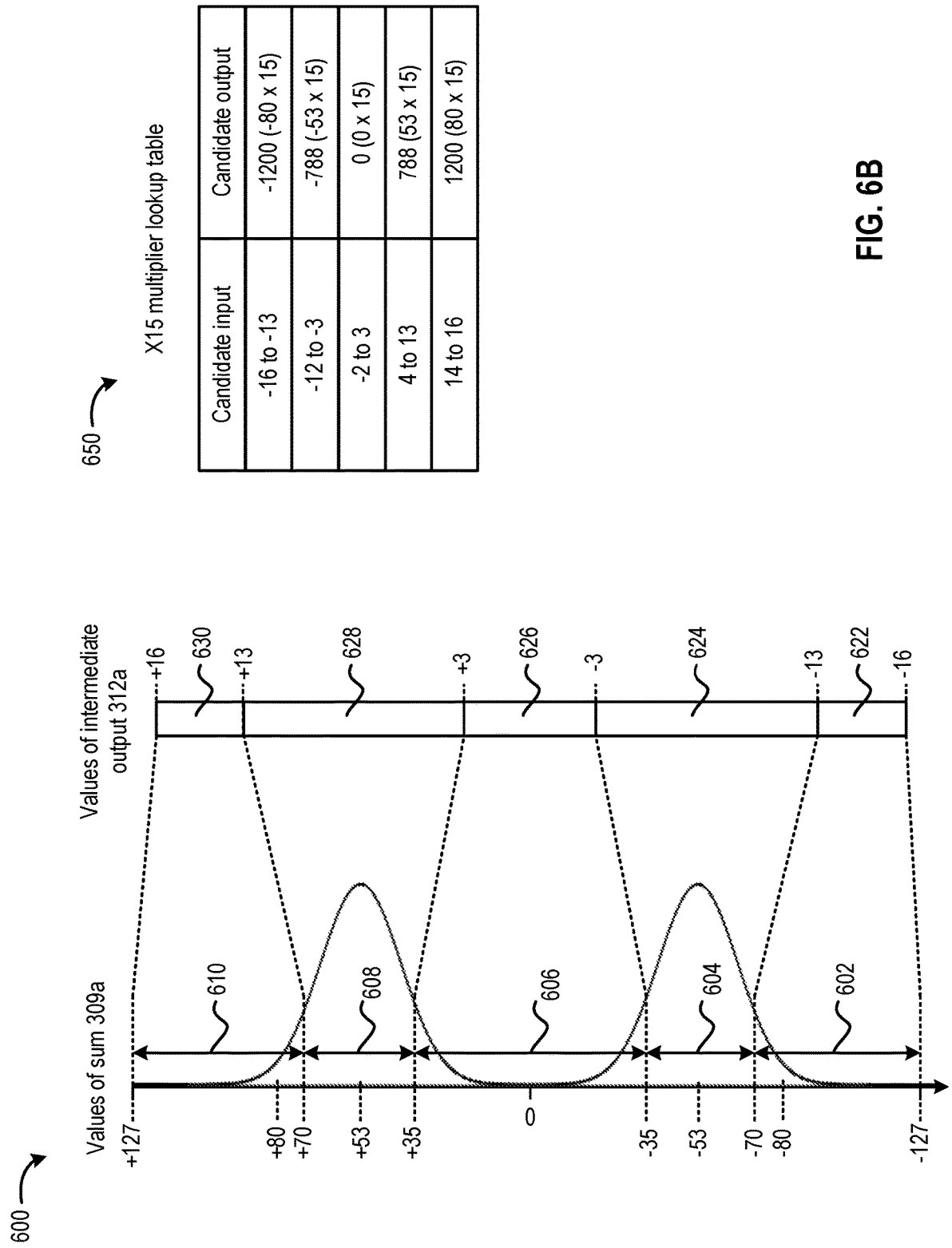

FIG. 6B illustrates an example of a multiplication lookup table 650 that can be used to estimate a result of multiplication between sum 309a and a pre-determined weight.

Multiplication lookup table 650 can receive a candidate input within a subrange of intermediate output 312a (e.g., one of subranges 622, 624, 626, 628, or 630). The candidate output, which represents a result of multiplication between a value of sum 309a (mapped to one of the subranges of intermediate output 312a) and a weight of 15, can be pre-configured as a result of multiplication between the weight and a representative value of sum 309a mapped to the subrange of intermediate output 312a.

In the example of FIG. 6B, the representative value of sum 309a can be chosen based on, for example, a probability-weighted average of sum 309a mapped to that subrange of intermediate output 312a, with the weights being determined based on the probability density distribution of the values of sum 309a. For example, subrange 602 (−127 to −70) of sum 309a is mapped to subrange 622 (−16 to −13) of intermediate outputs 312a. The probability-weighted average of sum 309a within subrange 602, based on the probability density distribution of sum 309a within subrange 602, is about −80. Therefore, for a candidate input within subrange 622 (−16 to −13), multiplication lookup table 650 can output a value of −1200, which represents the multiplication between the representative sum 309a within subrange 602 (−80) and the weight (15). Further, subrange 604 (−70 to −35) of sum 309a is mapped to subrange 624 (−12 to −3) of intermediate outputs 312a. The probability-weighted average of sum 309a within subrange 604, based on the probability density distribution of sum 309a within subrange 604, is about −53. Therefore, for a candidate input within subrange 624 (−12 to −3), multiplication lookup table 650 can output a value of −788 (multiplication between −53 and 15). Similarly, for a candidate input within subrange 606, the corresponding representative value of sum 309a (within subrange 606) is 0, and multiplication lookup table 650 can output a value of 0. Multiplication lookup table 650 can also output a value of +788 for a candidate input within subrange 628 of intermediate outputs 312a, and a value of +1200 for a candidate input within subrange 630 of intermediate outputs 312a. Multiplication lookup table 650 can be part of multiplication lookup table 320 of FIG. 3 and can be implemented based on, for example, multiplexer circuit 400 of FIG. 4, and/or as a data structure stored in a DRAM/SRAM device, as discussed above.

There are other ways to choose the representative values of sum 309a and to pre-configure the candidate outputs. As an example, instead of probability-weighted average, the representative value can be chosen as the mid-point of each subrange of sum 309a. For example, the mid-point of subrange 610 is about −100, and multiplication lookup table 650 can be preconfigured to output a value of 1500 (multiplication between 100 and 15) for a candidate input within the range of 14 to 16 (which corresponds to subrange 630 of intermediate output 312a, which is mapped to subrange 610 of sum 309a). As another example, the representative values of sum 309a can also be chosen as the values associated with the highest probability within each subrange of sum 309a. For example, the value of sum 309a associated with the highest probability within subrange 610 is 70, and multiplication lookup table 650 can be preconfigured to output a value of 850 (multiplication between 70 and 15) for a candidate input within the range of 14 to 16 (which corresponds to subrange 630 of intermediate output 312a, which is mapped to subrange 610 of sum 309a).

With such arrangements, the multiplication lookup table can be configured to output a reasonably accurate multiplication result for a quantized input, which can improve the probability of prediction model 108 making a correct decision. On the other hand, by performing probability-based quantization to reduce the number of bits of the input, not only that the complexity of the multiplication lookup table can be reduced, but also that the quantization errors (at the input and at the output of the multiplication lookup table) can be reduced. All these allows implementation of prediction model 108 using low-power lookup tables instead of high-power floating-point multipliers, while maximizing the probability of prediction model 108 generating a correct (or otherwise expected) decision.

Figure 7:
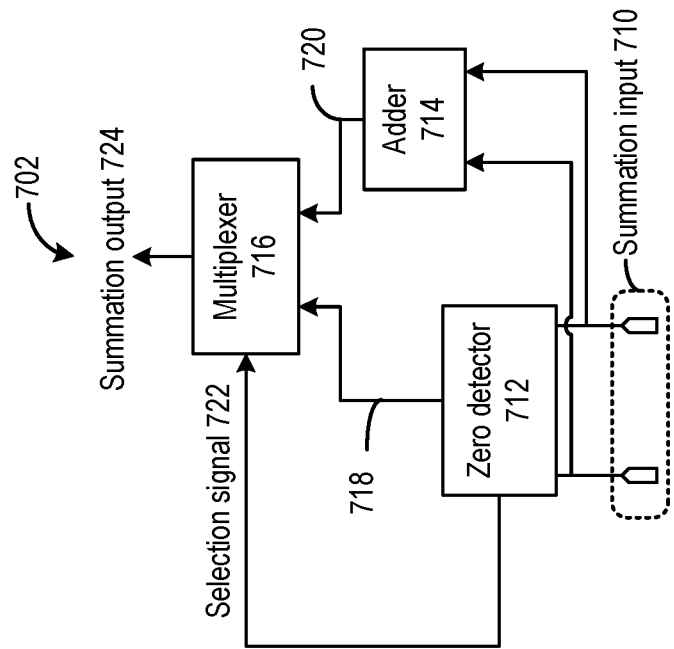
FIG. 7 illustrates an example internal structure of a summation circuit to implement the prediction model of FIG. 2, according to certain aspects of the present disclosure.
Figure 7:
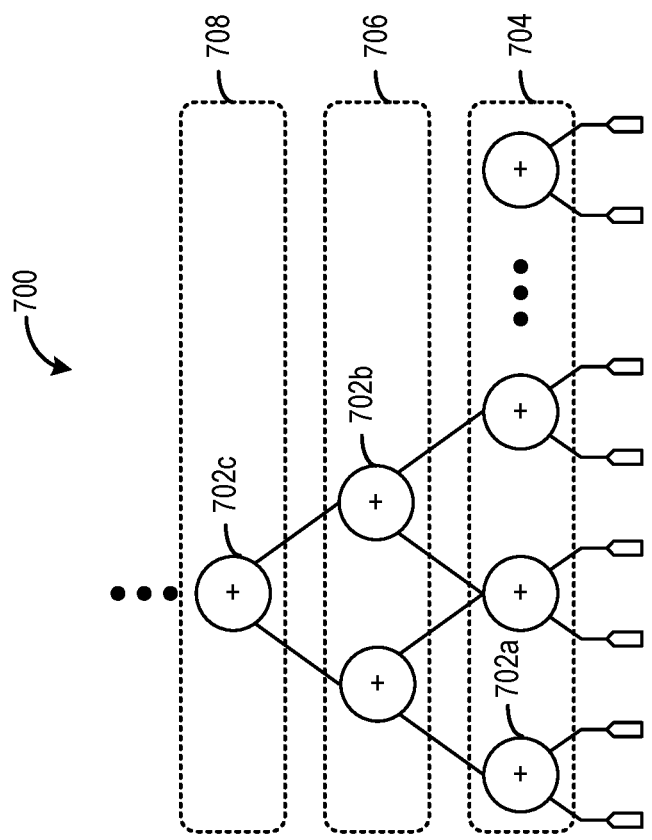

Other techniques may also be used to improve the operations of other components of prediction model 108, such as summation circuits 308 and 328. FIG. 7 illustrates an example internal structure of a summation circuit 700 included in summation circuits 308 and 328. As shown in FIG. 7, summation circuit 700 includes a plurality of summation sub-circuits 702 (e.g., summation sub-circuits 702a, 702b, and 702c), with each summation sub-circuit 702 configured to perform summation of two inputs to generate an output. Summation sub-circuits 702 can be arranged in a hierarchical structure comprising a plurality of layers. Summation sub-circuits 702 of layer 704 generates a set of sums for different pairs of inputs (e.g., a pair of multiplication outputs 304a, and 304b), and provide the set of sums to summation sub-circuits 702 of layer 706. The sums generated by layer 706 then propagates up to layer 708 and other layers above. The root of the hierarchical structure (not shown in FIG. 7) then generates the final sum.

The propagation delay of the sums between layers, which includes the time it takes for a summation sub-circuit 702 to perform the addition, adds substantial latency to the operations of the processing nodes of prediction model 108. To reduce the latency, a zero-skipping mechanism can be included in summation sub-circuit 702. For example, as shown in FIG. 7, summation sub-circuit 702 may include a zero detector 712, an adder 714, and a multiplexer 716. Each of zero detector 712 and adder 714 receives a pair of summation inputs 710, each of which may include a number of bits (e.g., 8 bits). Zero detector 712 may include a set of logic circuits to determine whether one (or all) of summation inputs 710 includes only zero bits. Zero detector 712 may also generate an output 718 by, for example, performing a bit-wise OR between each pair of bits of summation inputs 710. Output 718 will be identical to the non-zero summation input 710 (or zero if both of summation inputs 710 are zero). Adder 714 also generates an output 720 by adding the pair of summation inputs 710. If zero detector 712 detects that one of summation inputs 710 includes only zero bits, zero detector 712 may assert selection signal 722 to control multiplexer 716 to forward output 718 (from zero detector 712) to summation output 724 of summation sub-circuit 702, irrespective of whether adder 714 has completed the addition and generated output 720. With such arrangements, summation sub-circuit 702 can generate summation output 724 more efficiently in the event that the summation inputs include zero.

Figure 8:
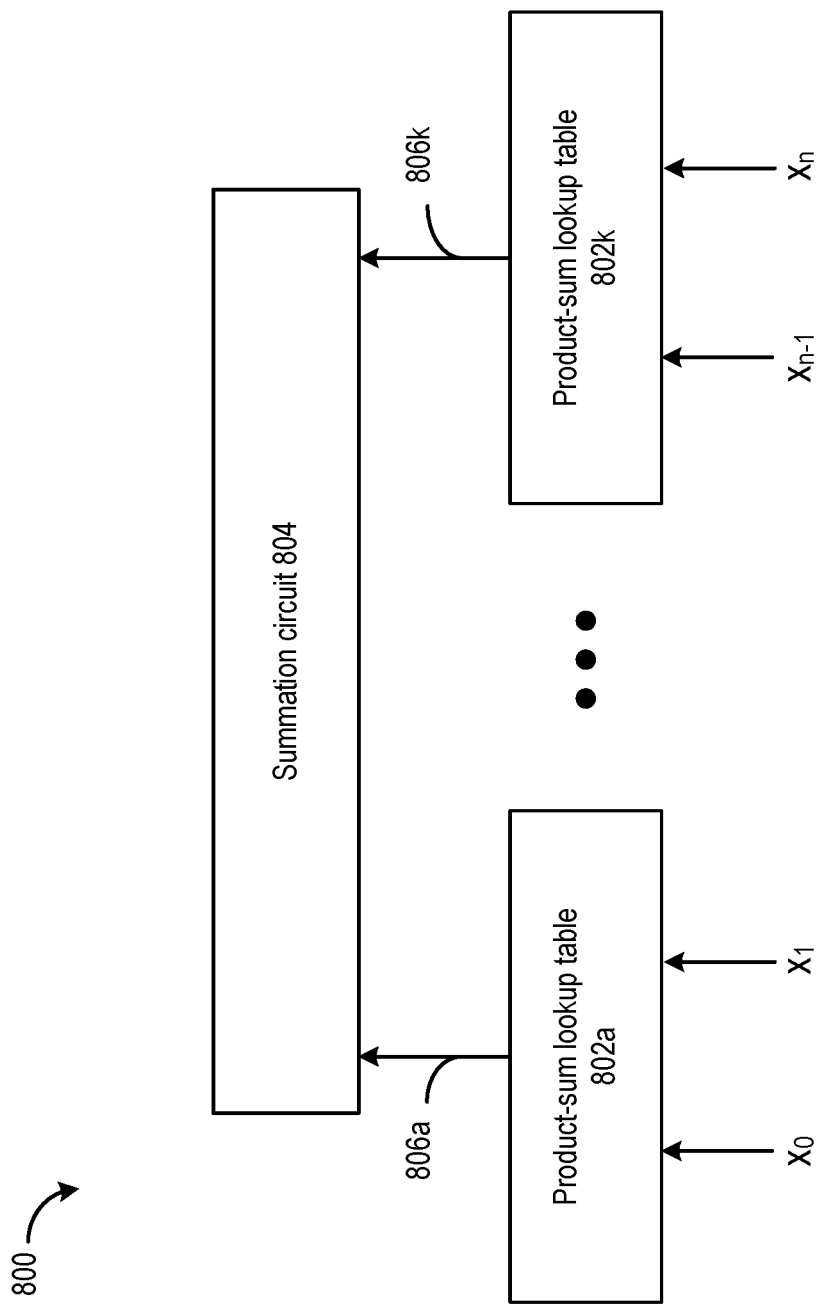
FIG. 8 illustrates an example product-sum circuit to implement the prediction model of FIG. 2, according to certain aspects of the present disclosure.

In some embodiments, summation circuits 308 and 328 may use lookup tables to perform summation of products (e.g., summation of scaled input values according to Equation 1). FIG. 8 illustrates an example product-sum circuit 800, which may include the functionalities of, for example, multiplication lookup tables 302a-302n (of processing nodes 208a-n) and summation circuit 308 of processing node 210a. In the example of FIG. 8, product-sum circuit 800 includes product-sum lookup tables 802 (e.g., product-sum lookup tables 802a and 802k). Each of product-sum lookup tables 802 may receive two inputs, and map a combination of the two inputs to one of a set of candidate output codes representing a sum of products of the two inputs and their associated weights. For example, product-sum lookup table 802a may map a set of candidate input codes including different combinations of pixel values $x_0$ and $x_1$ to a set of candidate output codes representing $W1_0 \times x_0 + W1_1 \times x_1$, where $W1_0$ and $W1_1$ are the weights associated, respectively, $x_0$ and $x_1$. Based on the received pixel values $x_0$ and $x_1$, product-sum lookup table 802a may output one of the set of candidate output codes to generate an output 806a. Moreover, product-sum lookup table 802k may also map a set of candidate input codes including different combinations of pixel values $x_{n-1}$ and $x_n$ to a set of candidate output codes representing $W1_{n-1} \times x_{n-1} + W1_n \times x_n$, where $W1_{n-1}$ and $W1_n$, are the weights associated, respectively, $x_{n-1}$ and $x_n$. Based on the received pixel values $x_{n-1}$ and $x_n$, product-sum lookup table 802k may output one of the set of candidate output codes to generate an output 806k. An upper level summation circuit 804 (e.g., including a set of summation sub-circuits 702) may generate a sum based on output 806*a* and 806*k* to represent, for example, $\text{sum}_{210a}$ of Equation 1 as described above.

With the arrangements of FIG. 8, at least some of summation sub-circuits 702 (or any other adder circuits) can be replaced by lookup tables. Moreover, by merging the sum and multiplication functions in a single lookup table and through further optimization, the number of logic circuits used to implement various processing nodes of prediction model 108 can be reduced. This can reduce the power consumption, as well as the footprint of an integrated circuit that implements the functionalities of prediction model 108.

Figure 9:
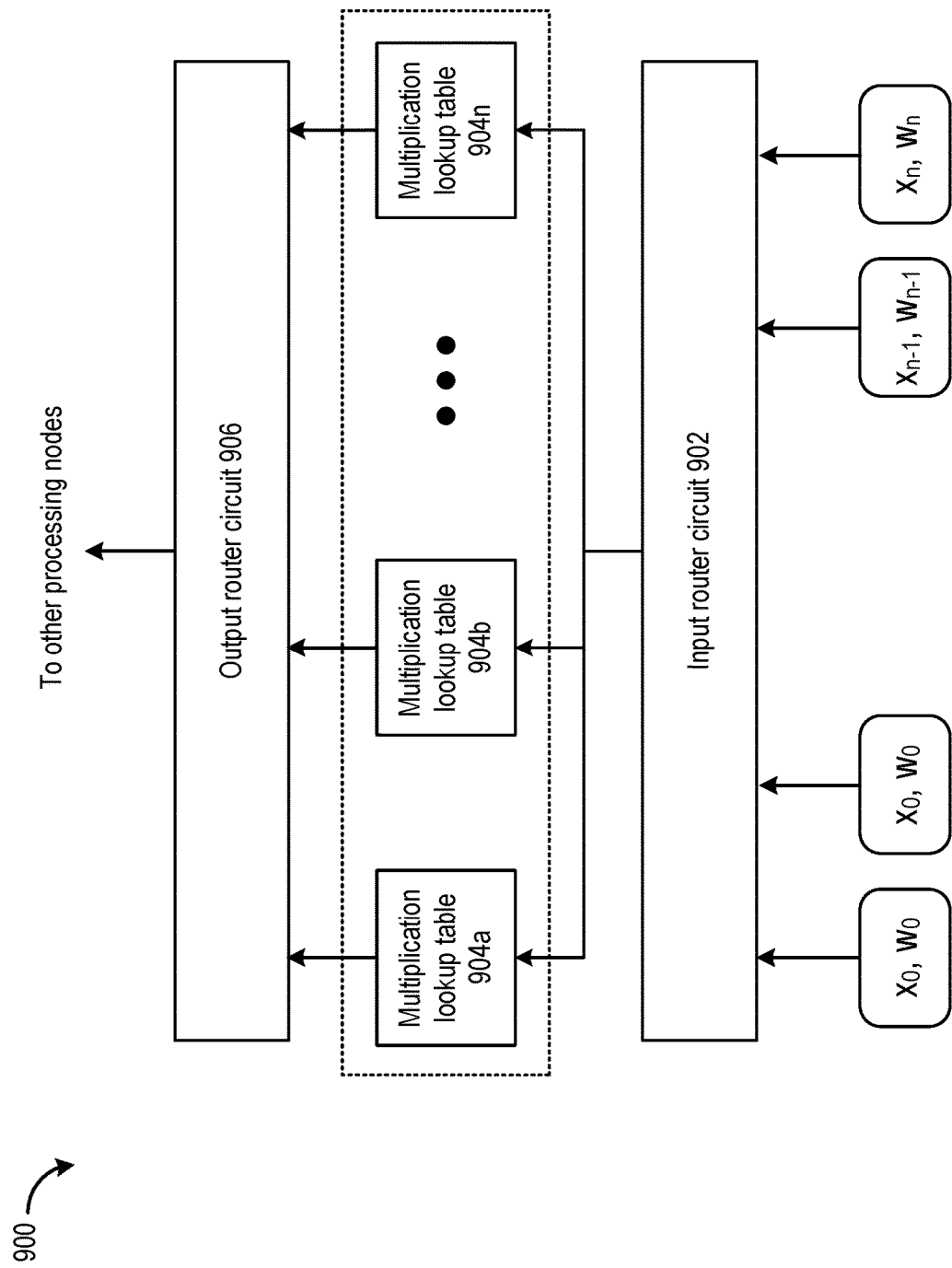
FIG. 9 illustrates another example product-sum circuit to implement the prediction model of FIG. 2, according to certain aspects of the present disclosure.

In some embodiments, to further reduce the number of logic circuits for prediction model 108, some of the multiplication lookup tables (e.g., 302, 302*b*, etc.) can be shared between different processing nodes. FIG. 9 illustrates an example product-sum circuit 900 that includes the sharing of the multiplication lookup tables. In the example of FIG. 9, product-sum circuit 900 includes an input router circuit 902 which receives pixel values $x_0$-$x_n$ and their associated weights $w_0$-$w_n$. The pairs of pixel value and weight may be provided by, for example, processing nodes 208*a*-208*n*. For example, processing node 208*a* may pair the pixel value $x_0$ with different weights, to generate different products for different processing nodes in intermediate layer 209.

Product-sum circuit 900 further includes a plurality of multiplication lookup tables 904*a*-904*n*, and an output router circuit 906. Each of multiplication lookup tables 904*a*-904*n* may be associated with a particular weight, and can map the same set of candidate input codes (which may represent the set of possible input values for each of pixel values $x_0$-$x_n$) to a set of candidate output codes representing a product between the candidate input code and the weight. For example, multiplication lookup table 904*a* may map a set of 5-bit numbers, from −15 to +15, to a set of candidate output codes representing the results of multiplication of the 5-bit numbers with a weight of 2. Multiplication lookup table 904*b* may map the same set of 5-bit numbers to a set of candidate output codes representing the results of multiplication of the 5-bit numbers with a weight of 4. Output router circuit 906 may forward the results of multiplication to the processing nodes (e.g., processing node 210*a*) of intermediate layer 209. Multiplication lookup tables 904*a*-904*n* may be implemented as multiplexers. The mappings information of multiplication lookup tables 904*a*-904*n* may also be stored in DRAM devices, SRAM devices, etc.

Input router circuit 902 can forward each pair of input pixel value and weight to one of multiplication lookup tables 904*a*-904*n* to generate the scaled pixel values (e.g., $W1_0 \times x_0$, $W1_1 \times x_1$, etc.). The forwarding can be based on, for example, matching the weight included in the input pair and the weight associated with the target multiplication lookup table. To speed up the generation of products, input router circuit 902 may forward multiple pairs of input pixel value and weight to multiple target multiplication lookup tables at the same time, so that multiple products can be generated at the same time. Multiplication lookup table 904*a* may also include, with the product output, an indicator of the weight and an indicator of the source of the pair of pixel value and weight is received, and transmit the product output and the indicators to output router circuit 906. Based on the indicators and the weight, output router circuit 906 can route the product output to one of the processing nodes (e.g., processing node 210*a*) of intermediate layer 209. Both input router circuit 902 and output router circuit 906 may include multiplexer circuits to perform the routing.

Other techniques can be used to further reduce the number of number of logic circuits for prediction model 108. For example, a pruning process can be performed after the training process of prediction model 108. As part of the pruning process, weights that are below a threshold can be removed, to reduce the set of weights to be multiplied with the input pixel values, and the size and/or number of lookup tables can be reduced as a result. After the pruning process, prediction model 108 can be retrained, and the candidate output codes to the multiplication lookup tables can be reprogrammed to reflect the updated weights, to further improve the accuracy of the classifier decision from prediction model 108.

Figure 10:
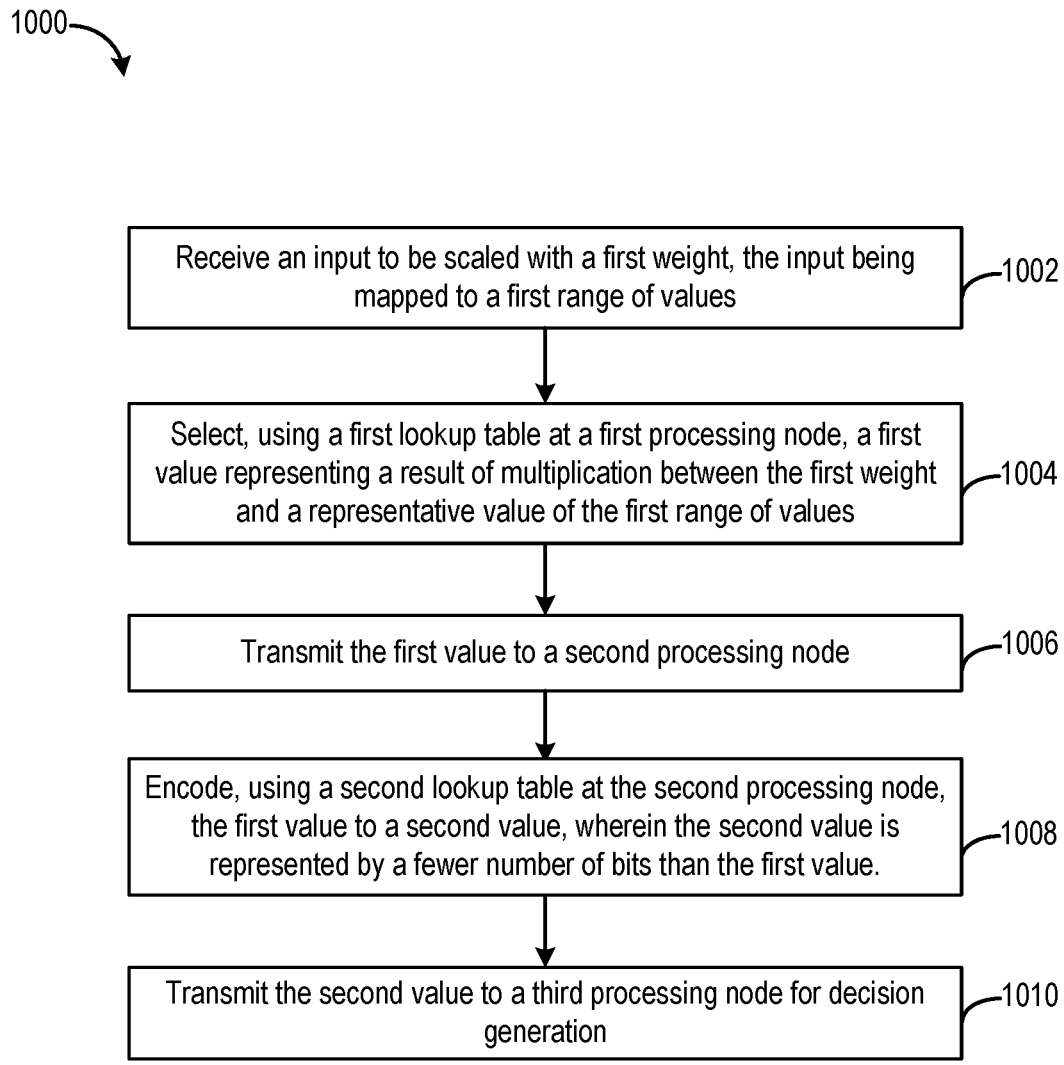
FIG. 10 illustrates an example flow diagram of a process for performing a computation at a neural network processing node, according to certain aspects of the present disclosure.

FIG. 10 illustrates an example flow diagram of a process 1000 for performing a computation at a neural network processing node, according to certain aspects of the present disclosure. The process may be implemented by one or more processing nodes of an artificial neural network (e.g., a processing node of FIG. 2), in combination with a set of lookup tables (e.g., multiplication lookup tables 302*a*-302*n*, activation lookup table 310*a*, etc.).

At operation 1002, a first processing node (e.g., processing node 208*a*) receives an input. The input can be part of an input vector and is to be scaled with a weight. The input can be mapped to a first range of values. For example, the input can be generated by quantizing a value within the first range of values. The input can be, for example, an intermediate output 312*a*, and the first range of values can be, for example, one of subranges 602, 604, 606, 608, or 610 of sum 309*a*.

At operation 1004, the first processing node selects, using a first lookup table (e.g., multiplication lookup table 302*a*), a first value representing a result of multiplication between a representative value of the first range of values and the associated first weight. As discussed above, the representative value can be selected based on, for example, a midpoint within the first range of values, a probability-weighted average of the first range of values, a value associated with the highest probability within the first range, etc. The first processing node then transmits the first value to a second processing node (e.g., processing node 210*a*), at operation 1006.

At operation 1008, the second processing node may encode, using a second lookup table (e.g., activation lookup table 310*a*), the first value to a second value, wherein the second value is represented by fewer number of bits than the first value. The second processing node then transmits the second value to a third processing node (e.g., processing node 212*a*), at operation 1010. The second value can be used to, for example, generate a decision of the artificial neural network.

Figure 11:
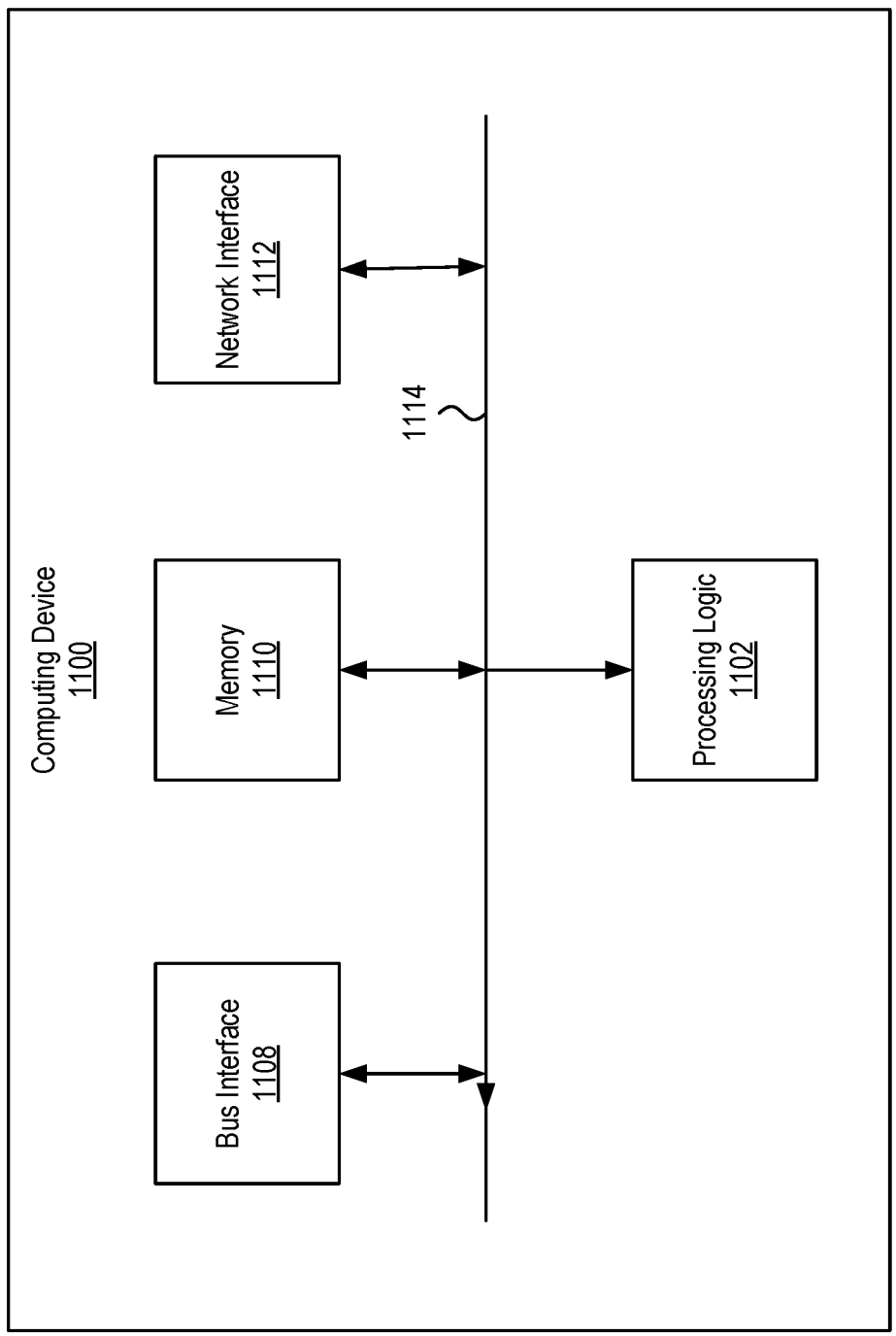
FIG. 11 illustrates an example of a computing device, according to certain aspects of the disclosure.

FIG. 11 illustrates an example of a computing device 1100. Functionality and/or several components of the computing device 1100 may be used without limitation with other embodiments disclosed elsewhere in this disclosure, without limitations. A computing device 1100 may perform computations to facilitate processing of a task. As an illustrative example, computing device 1100 can be part of a server in a multi-tenant compute service system. Various hardware and software resources of computing device 1100 (e.g., the hardware and software resources associated with provision of an image recognition service) can be allocated to a client upon request.

In one example, the computing device 1100 may include processing logic 1102, a bus interface module 1108, memory 1110, and a network interface module 1112. These modules may be hardware modules, software modules, or a combination of hardware and software. In certain instances, modules may be interchangeably used with components or engines, without deviating from the scope of the disclosure. The computing device 1100 may include additional modules, not illustrated here. In some implementations, the computing device 1100 may include fewer modules. In some implementations, one or more of the modules may be combined into one module. One or more of the modules may be in communication with each other over a communication channel 1114. The communication channel 1114 may include one or more busses, meshes, matrices, fabrics, a combination of these communication channels, or some other suitable communication channel.

The processing logic 1102 may include one or more integrated circuits, which may include application specific integrated circuits (ASICs), field programmable gate arrays (FPGAs), systems-on-chip (SoCs), network processing units (NPUs), processors configured to execute instructions or any other circuitry configured to perform logical arithmetic and floating point operations. Examples of processors that may be included in the processing logic 1102 may include processors developed by ARM®, MIPS®, AMD®, Intel®, Qualcomm®, and the like. In certain implementations, processors may include multiple processing cores, wherein each processing core may be configured to execute instructions independently of the other processing cores. Furthermore, in certain implementations, each processor or processing core may implement multiple processing threads executing instructions on the same processor or processing core, while maintaining logical separation between the multiple processing threads. Such processing threads executing on the processor or processing core may be exposed to software as separate logical processors or processing cores. In some implementations, multiple processors, processing cores or processing threads executing on the same core may share certain resources, such as for example busses, level 1 (L1) caches, and/or level 2 (L2) caches. The instructions executed by the processing logic 1102 may be stored on a computer-readable storage medium, for example, in the form of a computer program. The computer-readable storage medium may be non-transitory. In some cases, the computer-readable medium may be part of the memory 1110. Processing logic 1102 may also include hardware circuities for performing artificial neural network computation including, for example, multiplication lookup tables 302a-302n and 320a, summation circuits 308 and 328, multiplexer circuit 400, summation sub-circuits 702, product-sum circuits 800 and 900, etc.

The access to processing logic 1102 can be granted to a client to provide the personal assistant service requested by the client. For example, computing device 1100 may host a virtual machine, on which an image recognition software application can be executed. The image recognition software application, upon execution, may access processing logic 1102 to predict, for example, an object included in an image. As another example, access to processing logic 1102 can also be granted as part of bare-metal instance, in which an image recognition software application executing on a client device (e.g., a remote computer, a smart phone, etc.) can directly access processing logic 1102 to perform the recognition of an image.

The memory 1110 may include either volatile or non-volatile, or both volatile and non-volatile types of memory. The memory 1110 may, for example, include random access memory (RAM), read only memory (ROM), Electrically Erasable Programmable Read-Only Memory (EEPROM), flash memory, and/or some other suitable storage media. In some cases, some or all of the memory 1110 may be internal to the computing device 1100, while in other cases some or all of the memory may be external to the computing device 1100. The memory 1110 may store an operating system comprising executable instructions that, when executed by the processing logic 1102, provides the execution environment for executing instructions providing networking functionality for the computing device 1100. The memory 1110 may also store, for example, software applications for performing artificial neural network computation. For example, memory 1110 may store software routines related to the computations of equations 1-4 above. In a case where processing logic 1102 is in the form of FPGA, memory 1110 may store netlists data representing various logic circuit components of processing logic 1102.

The bus interface module 1108 may enable communication with external entities, such as a host device and/or other components in a computing system, over an external communication medium. The bus interface module 1108 may include a physical interface for connecting to a cable, socket, port, or other connection to the external communication medium.

The bus interface module 1108 may further include hardware and/or software to manage incoming and outgoing transactions. The bus interface module 1108 may implement a local bus protocol, such as Peripheral Component Interconnect (PCI) based protocols, Non-Volatile Memory Express (NVMe), Advanced Host Controller Interface (AHCI), Small Computer System Interface (SCSI), Serial Attached SCSI (SAS), Serial AT Attachment (SATA), Parallel ATA (PATA), some other standard bus protocol, or a proprietary bus protocol. The bus interface module 1108 may include the physical layer for any of these bus protocols, including a connector, power management, and error handling, among other things. In some implementations, the computing device 1100 may include multiple bus interface modules for communicating with multiple external entities. These multiple bus interface modules may implement the same local bus protocol, different local bus protocols, or a combination of the same and different bus protocols.

The network interface module 1112 may include hardware and/or software for communicating with a network. This network interface module 1112 may, for example, include physical connectors or physical ports for wired connection to a network, and/or antennas for wireless communication to a network. The network interface module 1112 may further include hardware and/or software configured to implement a network protocol stack. The network interface module 1112 may communicate with the network using a network protocol, such as for example TCP/IP, Infiniband, RoCE, Institute of Electrical and Electronics Engineers (IEEE) 802.11 wireless protocols, User Datagram Protocol (UDP), Asynchronous Transfer Mode (ATM), token ring, frame relay, High Level Data Link Control (HDLC), Fiber Distributed Data Interface (FDDI), and/or Point-to-Point Protocol (PPP), among others. In some implementations, the computing device 1100 may include multiple network interface modules, each configured to communicate with a different network. For example, in these implementations, the computing device 1100 may include a network interface module for communicating with a wired Ethernet network, a wireless 802.11 network, a cellular network, an Infiniband network, etc. In some embodiments, computing device 1100 may receive a set of parameters, such as the aforementioned weight vectors for generation of forget gate factor, input factor, output factor, etc. from a server through network interface module 1112.

The various components and modules of the computing device 1100, described above, may be implemented as discrete components, as a System on a Chip (SoC), as an ASIC, as an NPU, as an FPGA, or any combination thereof. In some embodiments, the SoC or other component may be communicatively coupled to another computing system to provide various services such as traffic monitoring, traffic shaping, computing, etc. In some embodiments of the technology, the SoC or other component may include multiple subsystems as disclosed herein.

The modules described herein may be software modules, hardware modules or a suitable combination thereof. If the modules are software modules, the modules can be embodied on a non-transitory computer readable medium and processed by a processor in any of the computer systems described herein. It should be noted that the described processes and architectures can be performed either in real-time or in an asynchronous mode prior to any user interaction. The modules may be configured in the manner suggested in FIG. 11 and/or functions described herein can be provided by one or more modules that exist as separate modules and/or module functions described herein can be spread over multiple modules.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. An integrated circuit for implementing a neural network, the integrated circuit comprising a field programmable gate array (FPGA) programmed to provide:
   memory circuits, each of the memory circuits configured to receive an input vector, the input vector comprising input elements, each input element being represented by a first number of bits and mapped to a respective range of values;
   a first lookup table circuit configured to select, for each input element of the input vector, a first value of a product between a weight of a weight vector and a representative value of the respective range of values mapped to the respective input element, the first value being represented by a second number of bits, the second number exceeding the first number;
   a dot-product generation circuit configured to process the first values to output a second value representing a dot-product between the input vector and the weight vector;
   a second lookup table circuit configured to select, based on the second value and on an activation function, an intermediate output, the intermediate output being represented by the first number of bits; and
   a decision circuit configured to generate a decision of the neural network based on the intermediate output.

2. The integrated circuit of claim 1, wherein:
   the second lookup table circuit is configured to select a code from a set of codes to represent a third value for the intermediate output; and
   the set of codes is pre-configured based on a probability density distribution of the second value.

3. The integrated circuit of claim 1, wherein:
   the first lookup table circuit is configured to receive a set of candidate values from which to select the first value; and
   the set of candidate values is provided to the first lookup table circuit based on each weight of the weight vector exceeding a pre-determined threshold.

4. The integrated circuit of claim 1, wherein the dot-product generation circuit comprises:
   a zero-detection circuit configured to detect, from the first values, a zero first value; and
   a summation circuit configured to:
      based on the detection of the zero first value, forward a non-zero first output of the first outputs to represent a result of summing the non-zero first output with the zero first output for generating the second value.

5. The integrated circuit of claim 1, wherein the integrated circuit further comprises an input router circuit configured to:
receive a first input value of the input vector and a first weight value of the weight vector;
determine, based on the first weight value, a target lookup table from the first lookup table circuit; and
forward the first input value to the target lookup table.

6. The integrated circuit of claim 1, wherein the first lookup table circuit implements one first lookup table and is configured to:
receive a first input value and a second input value of the input vector; and
generate the second value representing a sum of a first product and a second product, the first product representing a multiplication between the first input value and a first weight value, and the second product representing a multiplication between the second input value and a second weight value.

7. An integrated circuit, comprising:
a first circuit configured to receive an input value and generate a first intermediate value associated with a first range of values;
a second circuit comprising a set of multiplexer circuits configured to select, from a first set of candidate values and based on the first intermediate value, a first product of a weight value and a pre-determined value of the first range of values;
a third circuit configured to generate a second intermediate value based on a sum of the first product and a second product received from another circuit, the second intermediate value being associated with a second range of values; and
a fourth circuit configured to generate an output value based on the second intermediate value.

8. The integrated circuit of claim 7, wherein the pre-determined value of the first range of values comprises:
a mid-point of the first range of values; or
a probability-weighted average of the first range of values.

9. The integrated circuit of claim 7, wherein:
the generation of the output value comprises the fourth circuit being configured to select the output value from a second set of candidate values corresponding to a subrange of the second range of values; and
a size of the second set of candidate values is pre-set based on a cumulative probability density associated with the subrange of the second range of values.

10. The integrated circuit of claim 7, wherein the second circuit is configured to receive the first set of candidate values based on the weight value exceeding a pre-determined threshold.

11. The integrated circuit of claim 7, wherein the third circuit is configured to:
based on a determination that the second product is non-zero, generate the second intermediate value based on a sum of the first product and the second product.

12. The integrated circuit of claim 7, wherein the first circuit is configured to:
determine the weight value; and
forward the first intermediate value to the second circuit based on the weight value.

13. The integrated circuit of claim 7, wherein the input value is a first input value and the weight value is a first weight value, and wherein the second circuit is configured to:

receive a second input value; and
select, based on the first input value and the second input value and from the first set of candidate values, a sum-of-product representing a sum of a first product of the first input value and the first weight value and a second product of the second input value and a second weight value.

14. The integrated circuit of claim 7, wherein the fourth circuit is further configured to generate the output value based on applying a first activation function to the second intermediate value.

15. The integrated circuit of claim 7, wherein the first circuit is configured to generate the first intermediate value based on a second activation function to the input value.

16. The integrated circuit of claim 7, wherein:
the integrated circuit comprises a field-programmable gate array (FPGA); and
the second circuit is implemented on the FPGA.

17. The integrated circuit of claim 7, wherein:
the integrated circuit comprises a random-access memory (RAM) device; and
the second circuit comprises the RAM device programmed to store a mapping between the first set of candidate values and a set of input values, the set of input values including the first intermediate value.

18. A method, comprising:
receiving an input at a first neural processing node, wherein the input is associated with a first weight and is mapped to a first range;
selecting, using a lookup table at the first neural processing node, a first value of a result of multiplication of a selected value of the first range and the first weight;
generating, at a second neural processing node and based on the first value, a second value; and
generating a classifier output based on the second value.

19. The method of claim 18, wherein generating the second value comprises:
generating, using a summation circuit at the second neural processing node, a fourth value representing a sum of the second value and of a second result of multiplication of another selected value of the first range and a second weight.

20. The method of claim 19, wherein generating the second value further comprises applying an activation function to the fourth value to generate the second value.

21. The method of claim 18, wherein the lookup table is a first lookup table; and
wherein generating the second value comprises encoding, using a second lookup table, the first value to the second value; and
wherein the second value is represented by fewer bits than the first value.

22. The method of claim 18, wherein the lookup table is a first lookup table;
wherein the method further comprises: selecting, using a second lookup table at a third neural processing node and based on the second value, a third value representing a result of multiplication of a second weight with a selected value of a second range comprising the second value; and
wherein the classifier output is generated based on the third value.

23. The integrated circuit of claim 8, wherein the probability-weighted average of the first range of values is determined based on at least one of: a probability density distribution of input values, or a probability density distribution of the first intermediate values.

* * * * *